United States Patent
Lin et al.

(10) Patent No.: US 11,114,979 B2
(45) Date of Patent: Sep. 7, 2021

(54) FREQUENCY DETECTOR

(71) Applicant: Silicon Integrated Systems Corp., Hsinchu (TW)

(72) Inventors: Wen-Chi Lin, Hsinchu (TW); Keng-Nan Chen, Hsinchu (TW)

(73) Assignee: Silicon Integrated Systems Corp., Hsinchu (TW)

( * ) Notice: Subject to any disclaimer, the term of this patent is extended or adjusted under 35 U.S.C. 154(b) by 126 days.

(21) Appl. No.: 16/687,708

(22) Filed: Nov. 19, 2019

(65) Prior Publication Data
US 2020/0186089 A1   Jun. 11, 2020

(30) Foreign Application Priority Data
Dec. 11, 2018   (TW) .................. 10714458.9

(51) Int. Cl.
| | |
|---|---|
| *H03D 13/00* | (2006.01) |
| *H03L 7/093* | (2006.01) |
| *G04F 10/00* | (2006.01) |
| *H01L 29/872* | (2006.01) |

(52) U.S. Cl.
CPC ......... *H03D 13/001* (2013.01); *G04F 10/005* (2013.01); *H01L 29/872* (2013.01); *H03L 7/093* (2013.01)

(58) Field of Classification Search
CPC .... H03D 13/001; G04F 10/005; H01L 29/872
See application file for complete search history.

(56) References Cited

U.S. PATENT DOCUMENTS

| | | | | | |
|---|---|---|---|---|---|
| 2,995,707 | A | * | 8/1961 | De Jager ................ | G01R 23/00 324/76.44 |
| 3,304,505 | A | * | 2/1967 | Pricer ..................... | H03G 5/16 327/98 |
| 2003/0113122 | A1 | * | 6/2003 | Koga .................... | H04L 7/0278 398/155 |
| 2006/0239661 | A1 | * | 10/2006 | Yang ..................... | G11B 20/22 386/201 |
| 2008/0246516 | A1 | * | 10/2008 | Hoang ................. | H03D 13/004 327/12 |
| 2011/0187371 | A1 | * | 8/2011 | Takegoshi .......... | G01R 33/3621 324/322 |
| 2013/0294124 | A1 | * | 11/2013 | Fujita ..................... | H02M 7/04 363/84 |
| 2015/0214844 | A1 | * | 7/2015 | Kyono ............. | H02M 3/33569 363/21.02 |

(Continued)

*Primary Examiner* — Adam D Houston

(57) ABSTRACT

A frequency detector is used for detecting a frequency difference of a signal to be tested from a first time point to a second time point. The frequency detector includes: an alternating current coupled capacitor configured to receive the signal to be tested; a rectifying circuit electrically connected to the alternating current coupled capacitor; an analog-to-digital converter electrically connected to the rectifying circuit; a control unit electrically connected to the analog-to-digital converter; and a counter electrically connected to the rectifying circuit and the control unit, wherein the control unit is configured to calculate the frequency difference of the signal to be tested from the first time point to the second time point according to outputs of the analog-to-digital converter and outputs of the counter.

10 Claims, 4 Drawing Sheets

(56) References Cited

U.S. PATENT DOCUMENTS

| | | | |
|---|---|---|---|
| 2016/0056664 A1* | 2/2016 | Partovi | B60L 53/122 |
| | | | 307/104 |
| 2018/0342986 A1* | 11/2018 | Kovac | H03J 3/00 |
| 2019/0044505 A1* | 2/2019 | Yabuzaki | H02M 7/53873 |
| 2019/0097448 A1* | 3/2019 | Partovi | H01F 38/14 |
| 2019/0174590 A1* | 6/2019 | Wen | G01R 23/02 |
| 2020/0186089 A1* | 6/2020 | Lin | H01L 29/872 |
| 2021/0027608 A1* | 1/2021 | Shakedd | G06K 7/10425 |
| 2021/0091654 A1* | 3/2021 | Rajesh | H02M 1/08 |

* cited by examiner

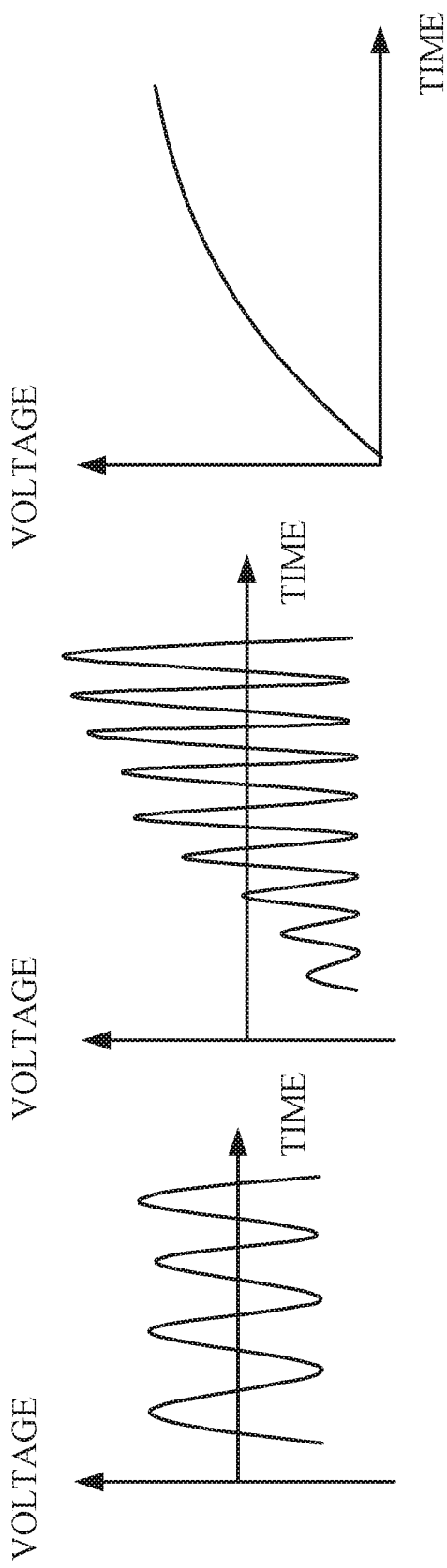

FREQUENCY DETECTOR

RELATED APPLICATION

This application claims the benefit of priority of Taiwan Patent Application No. 107144589 filed on Dec. 11, 2018, the contents of which are incorporated herein by reference in their entirety.

FIELD AND BACKGROUND OF THE INVENTION

The present disclosure relates to the field of frequency detection technologies, and more particularly to a frequency detector.

A conventional frequency detector detects a frequency of a circuit to be tested using a counter value, which is counted by a counter, of the circuit to be tested in a period and a count frequency.

Furthermore, operating frequencies in many circuits should be fixed and cannot be changed too much. Accordingly, frequency differences (changes) of detecting circuits are important. However, when the frequency differences of the circuit to be tested is detected using only a counter, the counter requires a longer count time if the accuracy the detected frequency differences requires being increased (e.g., from 10 kiloHertz (kHz) to 1 kHz). Alternatively, the accuracy the detected frequency differences can be increased using a counter having a higher count frequency. However, the problem that power is increased occurs.

Therefore, there is a need to solve the above-mentioned problems in the prior art.

SUMMARY OF THE INVENTION

An objective of the present disclosure is to provide a frequency detector capable of solving the problems in the prior art.

The frequency detector of the present disclosure is used for detecting a frequency difference of a signal to be tested from a first time point to a second time point. The frequency detector includes: an alternating current coupled capacitor configured to receive the signal to be tested; a rectifying circuit electrically connected to the alternating current coupled capacitor; an analog-to-digital converter electrically connected to the rectifying circuit; a control unit electrically connected to the analog-to-digital converter; and a counter electrically connected to the rectifying circuit and the control unit, wherein the control unit is configured to calculate the frequency difference of the signal to be tested from the first time point to the second time point according to outputs of the analog-to-digital converter and outputs of the counter.

The frequency detector of the present disclosure is used for detecting a frequency difference of a signal to be tested from a first time point to a second time point. The frequency detector includes: an alternating current coupled capacitor configured to receive the signal to be tested; a rectifying circuit electrically connected to the alternating current coupled capacitor; a time-to-digital converter electrically connected to the rectifying circuit; a control unit electrically connected to the time-to-digital converter; and a counter electrically connected to the rectifying circuit and the control unit, wherein the control unit is configured to calculate the frequency difference of the signal to be tested from the first time point to the second time point according to outputs of the time-to-digital converter and outputs of the counter.

In the frequency detector of the present disclosure, the frequency difference of the signal to be tested is converted into a voltage difference, thereby calculating the frequency difference. In the prior art, the frequency difference is calculated using a counter directly. The method of acquiring the frequency difference in the frequency detector of the present disclosure is different from the method of acquiring the frequency difference in the prior art. Furthermore, the frequency detector of the present disclosure includes the analog-to-digital converter or the time-to-digital converter. Accordingly, the accuracy of detecting the frequency difference can be increased. That is, the accuracy of detecting the frequency difference can be increased even though the frequency detector of the present disclosure does not require a longer count time or a count frequency of the counter does not require being increased.

BRIEF DESCRIPTION OF THE SEVERAL VIEW OF THE DRAWINGS

FIG. 1 illustrates a frequency detector in accordance with an embodiment of the present disclosure.

FIG. 2, FIG. 3 and FIG. 4 respectively illustrate a waveform of a signal to be tested, a waveform outputted by an alternating current coupled capacitor, and a waveform outputted by a rectifying circuit.

DESCRIPTION OF SPECIFIC EMBODIMENTS OF THE INVENTION

To make the objectives, technical schemes, and technical effects of the present disclosure more clearly and definitely, the present disclosure will be described in details below by using embodiments in conjunction with the appending drawings. It should be understood that the specific embodiments described herein are merely for explaining the present disclosure, and as used herein, the term "embodiment" refers to an instance, an example, or an illustration but is not intended to limit the present disclosure. In addition, the articles "a" and "an" as used in the specification and the appended claims should generally be construed to mean "one or more" unless specified otherwise or clear from the context to be directed to a singular form. Also, in the appending drawings, the components having similar or the same structure or function are indicated by the same reference number.

Figure 1:
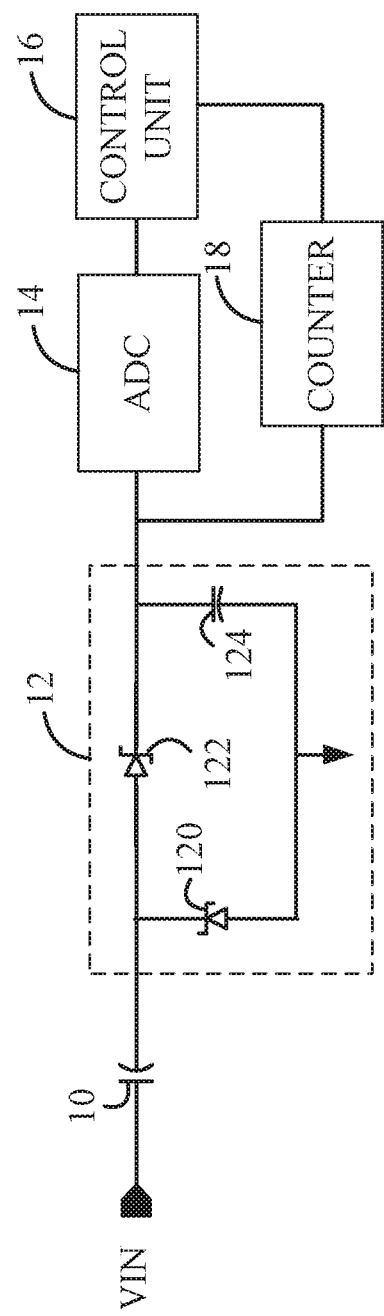

Please refer to FIG. 1. FIG. 1 illustrates a frequency detector in accordance with an embodiment of the present disclosure.

The frequency detector includes an alternating current (AC) coupled capacitor 10, a rectifying circuit 12, an analog-to-digital converter (ADC) 14, a control unit 16, and a counter 18. The frequency detector is used for detecting a frequency difference of a signal VIN to be tested from a first time point to a second time point. The signal VIN to be tested is generated by a circuit to be tested.

The alternating current coupled capacitor 10 is configured to receive the signal VIN to be tested and filter a low-frequency component of the signal VIN to be tested. In detail, one terminal of the alternating current coupled capacitor 10 is electrically connected to the signal VIN to be tested.

The rectifying circuit 12 is electrically connected to the alternating current coupled capacitor 10. In detail, an input terminal of the rectifying circuit 12 is electrically connected to the other terminal of the alternating current coupled capacitor 10.

The analog-to-digital converter 14 is electrically connected to the rectifying circuit 12. In detail, an input terminal of the analog-to-digital converter 14 is electrically connected to an output terminal of the rectifying circuit 12.

The control unit 16 is electrically connected to the analog-to-digital converter 14. In detail, an input terminal of the control unit 16 is electrically connected to an output terminal of the analog-to-digital converter 14.

The counter 18 is electrically connected to the rectifying circuit 12 and the control unit 16. In detail, an input terminal of the counter 18 is electrically connected to the output terminal of the rectifying circuit 12. An output terminal of the counter 18 is electrically connected to the other input terminal of the control unit 16.

The control unit 16 is configured to calculate the frequency difference of the signal VIN to be tested from the first time point to the second time point according to outputs of the analog-to-digital converter 14 and outputs of the counter 18.

For the first time point, the alternating current coupled capacitor 10 is configured to filter the low-frequency component of the signal VIN to be tested at the first time point and output a first filtered signal. The rectifying circuit 12 is configured to rectify the first filtered signal and output a first rectified signal. The analog-to-digital converter 14 is configured to convert the first rectified signal and output a first digital signal.

For the second time point, the alternating current coupled capacitor 10 is configured to filter the low-frequency component of the signal VIN to be tested at the second time point and output a second filtered signal. The rectifying circuit 12 is configured to rectify the second filtered signal and output a second rectified signal. The analog-to-digital converter 14 is configured to convert the second rectified signal and output a second digital signal.

The counter 18 is configured to count the first rectified signal and output a first counter value. The counter 18 is configured to count the second rectified signal and output a second counter value. The control unit 16 is configured to calculate the frequency difference of the signal VIN to be tested from the first time point to the second time point according to the first digital signal, the second digital signal, the first counter value, and the second counter value.

Please refer to FIG. 1 to FIG. 4. FIG. 2 to FIG. 4 respectively illustrate a waveform of the signal VIN to be tested, a waveform outputted by the alternating current coupled capacitor 10, and a waveform outputted by the rectifying circuit 12.

As shown in FIG. 2, the waveform of the signal VIN to be tested is a sine wave. As shown in FIG. 3, the waveform outputted by the alternating current coupled capacitor 10 is a waveform after the alternating current coupled capacitor 10 filters the low-frequency component of the signal VIN to be tested. As shown in FIG. 4, the waveform outputted by the rectifying circuit 12 is a waveform of a direct current component after the rectifying circuit 12 rectifies the filtered signal outputted by the alternating current coupled capacitor 10.

Figure 5:
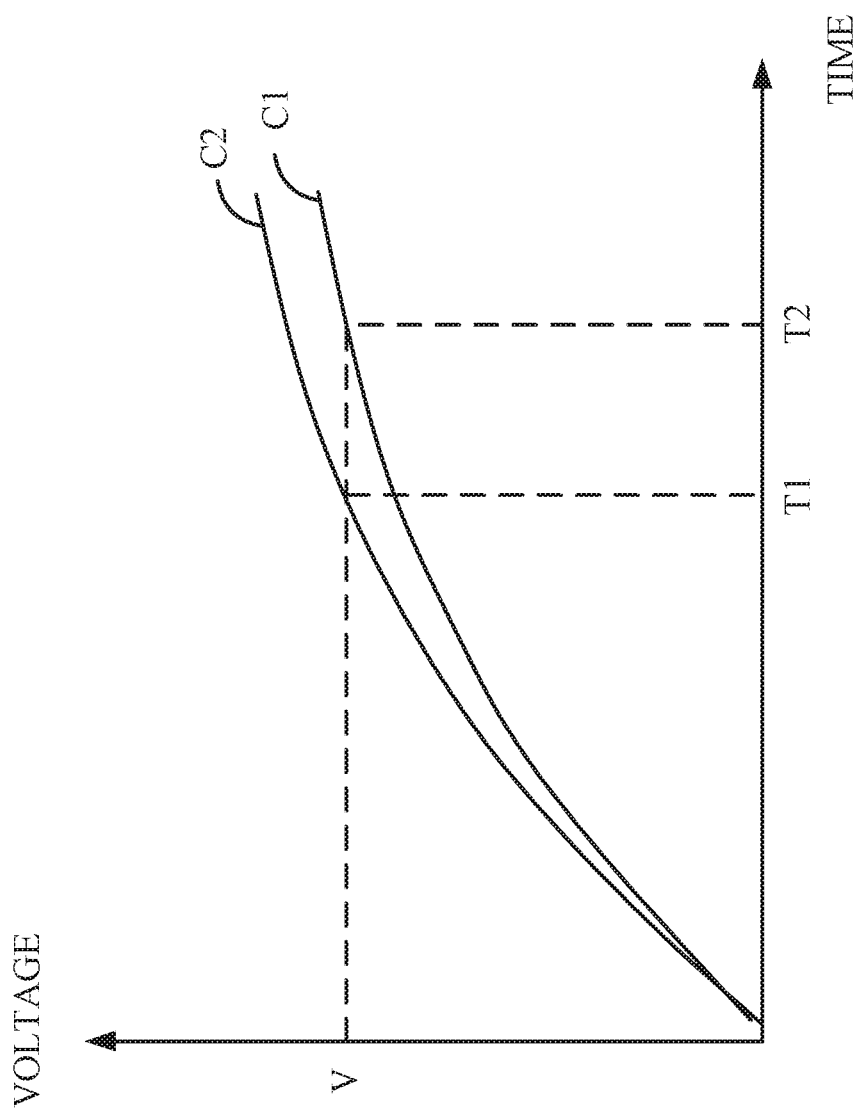
FIG. 5 illustrates a first rectified signal outputted by the rectifying circuit at a first time point and a second rectified signal outputted by the rectifying circuit at a second time point.

Please refer to FIG. 1 and FIG. 5. FIG. 5 illustrates a first rectified signal C1 outputted by the rectifying circuit 12 at the first time point and a second rectified signal C2 outputted by the rectifying circuit 12 at the second time point.

A principle of the frequency detector of the present disclosure is described as follows. The signal VIN to be tested at the first time point is converted into the first rectified signal C1 (i.e., first direct current rectified signal C1). The control unit 16 can acquire a time T2 at which the first rectified signal C1 reaches a voltage V. The counter 18 can count a counter value CV1 at which the first rectified signal C1 reaches the voltage V. Then, the signal VIN to be tested at the second time point is converted into the second rectified signal C2 (i.e., second direct current rectified signal C2). The control unit 16 can acquire a time T1 at which the second rectified signal C2 reaches the voltage V. The counter 18 can count a counter value CV2 at which the second rectified signal C2 reaches the voltage V. Finally, the control unit 16 calculates the frequency difference of the signal VIN to be tested from the first time point to the second time point according to a time difference (T2-T1), the counter value CV1 at which the first rectified signal C1 reaches the voltage V, the counter value CV2 at which the second rectified signal C2 reaches the voltage V, and a count frequency of the counter 18. The voltage V can be appropriately designed according to requirements.

For example, assuming that a frequency of the signal VIN to be tested at the first time point is 100 kHz, a frequency of the signal VIN to be tested at the second time point is 110 kHz, and the count frequency of the counter 18 is 100 MegaHertz (MHz). The frequency difference of the signal VIN to be tested from the first time point to the second time point is 10 kHz.

First, the control unit 16 can acquire that a time at which the first rectified signal C1 reaches the voltage V is 6 milliseconds (ms). The counter 18 can count that a counter value at which the first rectified signal C1 reaches the voltage V is 100. Then, the control unit 16 can acquire that a time at which the second rectified signal C2 reaches the voltage V is 5 ms. The counter 18 can count that a counter value at which the second rectified signal C2 reaches the voltage V is 110. Finally, the control unit 16 calculates the frequency difference F of the signal VIN to be tested from the first time point to the second time point according to the time difference (6 ms−5 ms=1 ms), a counter difference (110-100=10), and the count frequency (100 MHz) of the counter 18 as follows:

$$F=100 \text{ MHz}/(10/1 \text{ ms})=10 \text{ kHz}.$$

In the above-mentioned example, the control unit 16 calculates the frequency difference according to the first rectified signal C1 and the second rectified signal C2. However, as shown in FIG. 1, the frequency detector of the present disclosure includes the analog-to-digital converter 14. Accordingly, the control unit 16 also can calculate the frequency difference according to the first digital signal and the second digital signal.

In detail, the signal VIN to be tested at the first time point is converted into the first digital signal. The control unit 16 can acquire a time at which the first rectified signal corresponding to the first digital signal reaches the voltage V. The counter 18 can count a counter value at which the first rectified signal corresponding to the first digital signal reaches the voltage V. Then, the signal VIN to be tested at the second time point is converted into the second digital signal. The control unit 16 can acquire a time at which the second rectified signal corresponding to the second digital signal reaches the voltage V. The counter 18 can count a counter value at which the second rectified signal corresponding to the second digital signal reaches the voltage V. Finally, the control unit 16 calculates the frequency difference of the signal VIN to be tested from the first time point to the second time point according to a time difference, the counter value at which the first rectified signal corresponding to the first digital signal reaches the voltage V, the counter value at which the second rectified signal corresponding to the second digital signal reaches the voltage V, and the count frequency of the counter 18.

In the embodiment in FIG. 1, the rectifying circuit 12 includes a first Schottky diode 120, a second Schottky diode 122, and a first capacitor 124.

The first Schottky diode 120 includes a first anode and a first cathode. The first anode is electrically connected to a ground terminal. The first cathode is electrically connected to the other terminal of the alternating current coupled capacitor 10.

The second Schottky diode 122 includes a second anode and a second cathode. The second anode is electrically connected to the other terminal of the alternating current coupled capacitor 10. The second cathode is electrically connected to the input terminal of the analog-to-digital converter 14.

The first capacitor 124 is electrically connected between the input terminal of the analog-to-digital converter 14 and the ground terminal.

In the frequency detector of the present embodiment, the frequency difference of the signal to be tested is converted into a voltage difference, thereby calculating the frequency difference. In the prior art, the frequency difference is calculated using a counter directly. The method of acquiring the frequency difference in the frequency detector of the present embodiment is different from the method of acquiring the frequency difference in the prior art. Furthermore, the frequency detector of the present embodiment includes the analog-to-digital converter. Accordingly, the accuracy of detecting the frequency difference can be increased. That is, the accuracy of detecting the frequency difference can be increased even though the frequency detector of the present embodiment does not require a longer count time or a count frequency of the counter does not require being increased.

Figure 6:
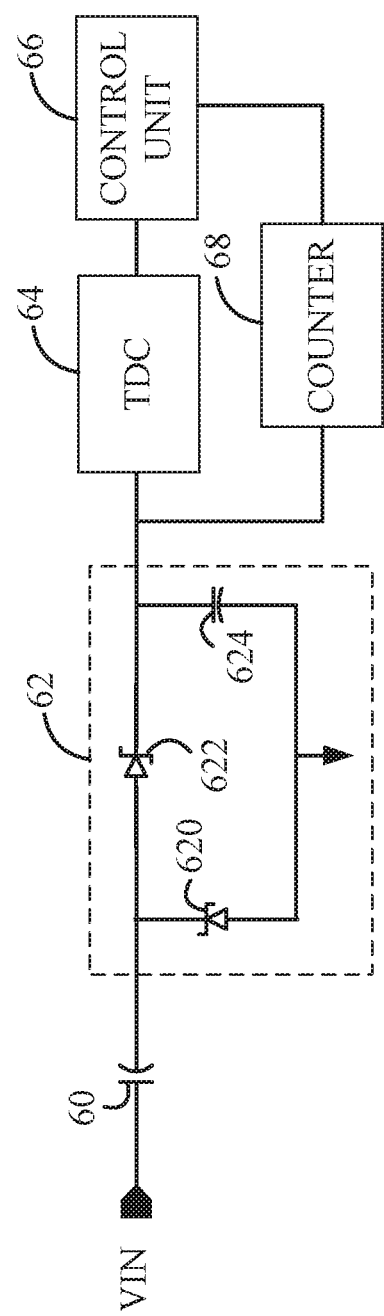
FIG. 6 illustrates a frequency detector in accordance with another embodiment of the present disclosure.

Please refer to FIG. 6. FIG. 6 illustrates a frequency detector in accordance with another embodiment of the present disclosure.

The frequency detector includes an alternating current (AC) coupled capacitor 60, a rectifying circuit 62, a time-to-digital converter (TDC) 64, a control unit 66, and a counter 68. The frequency detector is used for detecting a frequency difference of a signal VIN to be tested from a first time point to a second time point. The signal VIN to be tested is generated by a circuit to be tested.

The alternating current coupled capacitor 60 is configured to receive the signal VIN to be tested and filter a low-frequency component of the signal VIN to be tested. In detail, one terminal of the alternating current coupled capacitor 60 is electrically connected to the signal VIN to be tested.

The rectifying circuit 62 is electrically connected to the alternating current coupled capacitor 60. In detail, an input terminal of the rectifying circuit 62 is electrically connected to the other terminal of the alternating current coupled capacitor 60.

The time-to-digital converter 64 is electrically connected to the rectifying circuit 62. In detail, an input terminal of the time-to-digital converter 64 is electrically connected to an output terminal of the rectifying circuit 62.

The control unit 66 is electrically connected to the time-to-digital converter 64. In detail, an input terminal of the control unit 66 is electrically connected to an output terminal of the time-to-digital converter 64.

The counter 68 is electrically connected to the rectifying circuit 62 and the control unit 66. In detail, an input terminal of the counter 68 is electrically connected to the output terminal of the rectifying circuit 62. An output terminal of the counter 68 is electrically connected to the other input terminal of the control unit 66.

The control unit 66 is configured to calculate the frequency difference of the signal VIN to be tested from the first time point to the second time point according to outputs of the time-to-digital converter 64 and outputs of the counter 68.

For the first time point, the alternating current coupled capacitor 60 is configured to filter the low-frequency component of the signal VIN to be tested at the first time point and output a first filtered signal. The rectifying circuit 62 is configured to rectify the first filtered signal and output a first rectified signal. The time-to-digital converter 64 is configured to convert the first rectified signal and output a first digital signal.

For the second time point, the alternating current coupled capacitor 60 is configured to filter the low-frequency component of the signal VIN to be tested at the second time point and output a second filtered signal. The rectifying circuit 62 is configured to rectify the second filtered signal and output a second rectified signal. The time-to-digital converter 64 is configured to convert the second rectified signal and output a second digital signal.

The counter 68 is configured to count the first rectified signal and output a first counter value. The counter 68 is configured to count the second rectified signal and output a second counter value. The control unit 66 is configured to calculate the frequency difference of the signal VIN to be tested from the first time point to the second time point according to the first digital signal, the second digital signal, the first counter value, and the second counter value.

In the present embodiment, a waveform of the signal VIN to be tested, a waveform outputted by the alternating current coupled capacitor 60, and a waveform outputted by the rectifying circuit 62 can be referred to FIG. 2 to FIG. 4 respectively and are not repeated herein.

A difference between the frequency detector in the present embodiment and the frequency detector in FIG. 1 is that the frequency detector in the present embodiment uses the time-to-digital converter 64.

A principle of the frequency detector of the present disclosure is described as follows. The signal VIN to be tested at the first time point is converted into the first rectified signal (i.e., first direct current rectified signal). The control unit 66 can acquire a time at which the first rectified signal reaches a voltage. The counter 68 can count a counter value at which the first rectified signal reaches the voltage. Then, the signal VIN to be tested at the second time point is converted into the second rectified signal (i.e., second direct current rectified signal). The control unit 66 can acquire a time at which the second rectified signal reaches the voltage. The counter 68 can count a counter value at which the second rectified signal reaches the voltage. Finally, the control unit 66 calculates the frequency difference of the signal VIN to be tested from the first time point to the second time point according to a time difference between the time at which the first rectified signal reaches the voltage and the time at which the second rectified signal reaches the voltage, the counter value at which the first rectified signal reaches the voltage, the counter value at which the second rectified signal reaches the voltage, and a count frequency of the counter 68. The voltage can be appropriately designed according to requirements.

In the above-mentioned example, the control unit 66 calculates the frequency difference according to the first rectified signal and the second rectified signal. However, as shown in FIG. 6, the frequency detector of the present disclosure includes the time-to-digital converter 64. Accordingly, the control unit 66 also can calculate the frequency difference according to the first digital signal and the second digital signal.

In detail, the signal VIN to be tested at the first time point is converted into the first digital signal. The control unit 66 can acquire a time at which the first rectified signal corresponding to the first digital signal reaches the voltage. The counter 68 can count a counter value at which the first rectified signal corresponding to the first digital signal reaches the voltage. Then, the signal VIN to be tested at the second time point is converted into the second digital signal. The control unit 66 can acquire a time at which the second rectified signal corresponding to the second digital signal reaches the voltage. The counter 68 can count a counter value at which the second rectified signal corresponding to the second digital signal reaches the voltage. Finally, the control unit 66 calculates the frequency difference of the signal VIN to be tested from the first time point to the second time point according to a time difference between the time at which the first rectified signal reaches the voltage and the time at which the second rectified signal reaches the voltage, the counter value at which the first rectified signal corresponding to the first digital signal reaches the voltage, the counter value at which the second rectified signal corresponding to the second digital signal reaches the voltage, and the count frequency of the counter 68.

In the present embodiment, the rectifying circuit 62 includes a first Schottky diode 620, a second Schottky diode 622, and a first capacitor 624.

The first Schottky diode 620 includes a first anode and a first cathode. The first anode is electrically connected to a ground terminal. The first cathode is electrically connected to the other terminal of the alternating current coupled capacitor 60.

The second Schottky diode 622 includes a second anode and a second cathode. The second anode is electrically connected to the other terminal of the alternating current coupled capacitor 60. The second cathode is electrically connected to the input terminal of the time-to-digital converter 64.

The first capacitor 624 is electrically connected between the input terminal of the time-to-digital converter 64 and the ground terminal.

Content not described in the present embodiment can be referred to corresponding description in the embodiment of FIG. 1 and is not repeated herein.

In the frequency detector of the present disclosure, the frequency difference of the signal to be tested is converted into a voltage difference, thereby calculating the frequency difference. In the prior art, the frequency difference is calculated using a counter directly. The method of acquiring the frequency difference in the frequency detector of the present disclosure is different from the method of acquiring the frequency difference in the prior art. Furthermore, the frequency detector of the present disclosure includes the analog-to-digital converter or the time-to-digital converter. Accordingly, the accuracy of detecting the frequency difference can be increased. That is, the accuracy of detecting the frequency difference can be increased even though the frequency detector of the present disclosure does not require a longer count time or a count frequency of the counter does not require being increased.

While the preferred embodiments of the present disclosure have been illustrated and described in detail, various modifications and alterations can be made by persons skilled in this art. The embodiment of the present disclosure is therefore described in an illustrative but not restrictive sense. It is intended that the present disclosure should not be limited to the particular forms as illustrated, and that all modifications and alterations which maintain the spirit and realm of the present disclosure are within the scope as defined in the appended claims.

What is claimed is:

1. A frequency detector, used for detecting a frequency difference of a signal to be tested from a first time point to a second time point, the frequency detector comprising:
    an alternating current coupled capacitor configured to receive the signal to be tested;
    a rectifying circuit electrically connected to the alternating current coupled capacitor;
    an analog-to-digital converter electrically connected to the rectifying circuit;
    a control unit electrically connected to the analog-to-digital converter; and
    a counter electrically connected to the rectifying circuit and the control unit,
    wherein the control unit is configured to calculate the frequency difference of the signal to be tested from the first time point to the second time point according to outputs of the analog-to-digital converter and outputs of the counter.

2. The frequency detector according to claim 1, wherein the alternating current coupled capacitor is configured to filter the signal to be tested at the first time point and output a first filtered signal, the rectifying circuit is configured to rectify the first filtered signal and output a first rectified signal, and the analog-to-digital converter is configured to convert the first rectified signal and output a first digital signal,
    the alternating current coupled capacitor is configured to filter the signal to be tested at the second time point and output a second filtered signal, the rectifying circuit is configured to rectify the second filtered signal and output a second rectified signal, and the analog-to-digital converter is configured to convert the second rectified signal and output a second digital signal.

3. The frequency detector according to claim 2, wherein the control unit is configured to acquire a time at which the first rectified signal corresponding to the first digital signal reaches a voltage, and the counter is configured to count a counter value at which the first rectified signal corresponding to the first digital signal reaches the voltage,
    the control unit is configured to acquire a time at which the second rectified signal corresponding to the second digital signal reaches the voltage, and the counter is configured to count a counter value at which the second rectified signal corresponding to the second digital signal reaches the voltage,
    the control unit is configured to calculate the frequency difference of the signal to be tested from the first time point to the second time point according to a time difference between the time at which the first rectified signal reaches the voltage and the time at which the second rectified signal reaches the voltage, the counter value at which the first rectified signal corresponding to the first digital signal reaches the voltage, the counter value at which the second rectified signal corresponding to the second digital signal reaches the voltage, and a count frequency of the counter.

4. The frequency detector according to claim 2, wherein the alternating current coupled capacitor is configured to filter a low-frequency component of the signal to be tested at the first time point, and the alternating current coupled capacitor is configured to filter a low-frequency component of the signal to be tested at the second time point.

5. The frequency detector according to claim 1, wherein the rectifying circuit comprises:
   a first Schottky diode comprising a first anode and a first cathode, the first anode electrically connected to a ground terminal, and the first cathode electrically connected to the alternating current coupled capacitor;
   a second Schottky diode comprising a second anode and a second cathode, the second anode electrically connected to the alternating current coupled capacitor, and the second cathode electrically connected to the analog-to-digital converter; and
   a first capacitor electrically connected between the analog-to-digital converter and the ground terminal.

6. A frequency detector, used for detecting a frequency difference of a signal to be tested from a first time point to a second time point, the frequency detector comprising:
   an alternating current coupled capacitor configured to receive the signal to be tested;
   a rectifying circuit electrically connected to the alternating current coupled capacitor;
   a time-to-digital converter electrically connected to the rectifying circuit;
   a control unit electrically connected to the time-to-digital converter; and
   a counter electrically connected to the rectifying circuit and the control unit,
   wherein the control unit is configured to calculate the frequency difference of the signal to be tested from the first time point to the second time point according to outputs of the time-to-digital converter and outputs of the counter.

7. The frequency detector according to claim 6, wherein the alternating current coupled capacitor is configured to filter the signal to be tested at the first time point and output a first filtered signal, the rectifying circuit is configured to rectify the first filtered signal and output a first rectified signal, and the time-to-digital converter is configured to convert the first rectified signal and output a first digital signal,
the alternating current coupled capacitor is configured to filter the signal to be tested at the second time point and output a second filtered signal, the rectifying circuit is configured to rectify the second filtered signal and output a second rectified signal, and the time-to-digital converter is configured to convert the second rectified signal and output a second digital signal.

8. The frequency detector according to claim 7, wherein the control unit is configured to acquire a time at which the first rectified signal corresponding to the first digital signal reaches a voltage, and the counter is configured to count a counter value at which the first rectified signal corresponding to the first digital signal reaches the voltage,
   the control unit is configured to acquire a time at which the second rectified signal corresponding to the second digital signal reaches the voltage, and the counter is configured to count a counter value at which the second rectified signal corresponding to the second digital signal reaches the voltage,
   the control unit is configured to calculate the frequency difference of the signal to be tested from the first time point to the second time point according to a time difference between the time at which the first rectified signal reaches the voltage and the time at which the second rectified signal reaches the voltage, the counter value at which the first rectified signal corresponding to the first digital signal reaches the voltage, the counter value at which the second rectified signal corresponding to the second digital signal reaches the voltage, and a count frequency of the counter.

9. The frequency detector according to claim 7, wherein the alternating current coupled capacitor is configured to filter a low-frequency component of the signal to be tested at the first time point, and the alternating current coupled capacitor is configured to filter a low-frequency component of the signal to be tested at the second time point.

10. The frequency detector according to claim 6, wherein the rectifying circuit comprises:
    a first Schottky diode comprising a first anode and a first cathode, the first anode electrically connected to a ground terminal, and the first cathode electrically connected to the alternating current coupled capacitor;
    a second Schottky diode comprising a second anode and a second cathode, the second anode electrically connected to the alternating current coupled capacitor, and the second cathode electrically connected to the time-to-digital converter; and
    a first capacitor electrically connected between the time-to-digital converter and the ground terminal.

* * * * *